United States Patent
Apfelbacher et al.

(10) Patent No.: US 7,027,303 B2
(45) Date of Patent: Apr. 11, 2006

(54) ELECTRONIC POWER MODULE

(75) Inventors: Walter Apfelbacher, Freihung (DE);
Heinrich Gerstenköper, Warstein (DE); Ralf Jörke, Warstein (DE);
Elmar Krause, Warstein (DE);
Gerhard Mewissen, Reinheim (DE);
Norbert Reichenbach, Amberg (DE)

(73) Assignee: Siemens Aktiengesellschaft, Munich (DE)

( * ) Notice: Subject to any disclaimer, the term of this patent is extended or adjusted under 35 U.S.C. 154(b) by 154 days.

(21) Appl. No.: 10/275,329

(22) PCT Filed: Apr. 25, 2001

(86) PCT No.: PCT/DE01/01566

§ 371 (c)(1),
(2), (4) Date: Jun. 20, 2003

(87) PCT Pub. No.: WO01/87032

PCT Pub. Date: Nov. 15, 2001

(65) Prior Publication Data

US 2004/0120096 A1    Jun. 24, 2004

(30) Foreign Application Priority Data

May 8, 2000    (DE) ................................ 100 23 341

(51) Int. Cl.
*H05K 7/20*    (2006.01)

(52) U.S. Cl. .................... 361/704; 361/707; 361/712; 361/717; 361/719; 257/675; 257/706; 257/707; 165/80.3; 165/185

(58) Field of Classification Search ................ 361/624, 361/704, 707, 807–813; 257/703–707, 727; 174/16.1, 16.3; 165/80.3, 185
See application file for complete search history.

(56) References Cited

U.S. PATENT DOCUMENTS

| | | | |
|---|---|---|---|
| 4,385,310 A | | 5/1983 | Houston |
| 4,504,886 A | | 3/1985 | Cygan et al. |
| 4,853,762 A | * | 8/1989 | Ewer et al. ................. 257/727 |
| 4,853,828 A | | 8/1989 | Penn |
| 4,965,658 A | * | 10/1990 | Norbeck et al. ............ 257/712 |
| 5,168,425 A | * | 12/1992 | Radack, Jr. ................. 361/717 |
| 5,489,802 A | * | 2/1996 | Sakamoto et al. .......... 257/688 |
| 5,798,566 A | * | 8/1998 | Sato et al. .................. 257/712 |
| 6,122,170 A | * | 9/2000 | Hirose et al. ............... 361/704 |
| 6,297,549 B1 | * | 10/2001 | Hiyoshi ...................... 257/703 |
| 6,303,974 B1 | * | 10/2001 | Irons et al. ................. 257/584 |
| 6,864,574 B1 | * | 3/2005 | Nobori et al. .............. 257/720 |

FOREIGN PATENT DOCUMENTS

| | | |
|---|---|---|
| DE | 19533298 | 3/1997 |
| DE | 19651632 | 6/1998 |
| GB | 2051474 | 1/1981 |

* cited by examiner

*Primary Examiner*—Boris Chérvinsky
(74) *Attorney, Agent, or Firm*—Harness, Dickey & Pierce, P.L.C.

(57) ABSTRACT

The inventive electronic power module is provided for effecting the smooth starting of motors. The module essentially includes two semiconductor elements, which are connected in an electrically anti-parallel manner and which are clamped between two metal bars, having a high thermal capacity, e.g. made of copper, by a pressing device. After being intermediately stored in the metal bars, the heat loss of the semiconductor elements is dissipated by cooling bodies placed on the metal bars.

23 Claims, 2 Drawing Sheets

ELECTRONIC POWER MODULE

This application is the national phase under 35 U.S.C. § 371 of PCT International Application No. PCT/DE01/01566 which has an International filing date of Apr. 25, 2001, which designated the United States of America and which claims priority on German Patent Application number DE 100 22 341.9 filed May 8, 2000, the entire contents of which are hereby incorporated herein by reference.

FIELD OF THE INVENTION

The invention generally relates to an electronic power module. In particular, it relates to one for an electronic motor control device for the smooth starting of motors, with two semiconductor elements which are connected in an electrically anti-parallel manner and with at least one heat sink for dissipating the heat loss of the semiconductor elements.

BACKGROUND OF THE INVENTION

An electronic power module of the generic type is known as a component part of a power-electronic unit for the smooth starting of motors. The power-electronic unit here includes one or more electronic power modules, which have to be designed for short-term loading. The electronic power module serves for carrying and influencing current in a phase, i.e., depending on whether there is a single-phase or three-phase system, an appropriate number of electronic power modules are required.

A power-electronic unit of this type only carries current in the starting phase of the motor, the current being taken over in the operating phase by a switching device connected in parallel.

In the smooth starting of motors, the current is only a fraction of the direct starting current of the motor. Typically, the current during starting is 25% to 75% of the direct starting current. However, smooth starting at reduced current results in a prolonged starting time for the motor in comparison with direct starting.

In the starting phase, very high power losses occur in the semiconductors of the electronic power modules. By suitable combination of the power module or power semiconductor and heat sink, it must be ensured that the barrier-layer temperature permissible for the semiconductors is not exceeded, to avoid their destruction. On account of restricted space in the switch cabinet, there is also the requirement to minimize the amount of space needed for the electronic power modules.

An embodiment of an electronic power module in which two individual thyristors are connected in an anti-parallel manner and are pressed between two symmetrical halves of a heat sink is known but not documented by printed publications. One of the two halves of the heat sink is centrally divided and the two halves are connected by a flexible, electrically conductive connection. This makes it possible for the thyristor disk cells to be pressed over their surface area, even if the height of the disk cells differs. The two halves of the heat sink of this known power section, which is designed both for short-term loading and for continuous operation, are part of the power circuit and are consequently under potential.

The short-term loading occurring in smooth starting causes a very high power loss in the silicon cell, which leads to heating of the disk cell immediately after loading begins. After approximately 2 to 5 seconds, a constant temperature difference is established between the silicon cell and the heat sink, i.e. the disk cell is thermally in the steady state, in which virtually the entire power loss is then used for heating the heat sink. The cooling of the power section is performed here by a fan.

SUMMARY OF THE INVENTION

An embodiment of the invention can be based on an object of providing an electronic power module with good heat dissipation, high storage capacity for the heat dissipated by the semiconductor elements in smooth starting at the same time as a simple construction and low space requirement. An object may be achieved by at least two conducting bars, between which the two semiconductor elements are clamped by use of pressure contacting. This configuration has the particular advantage that the conducting bars no longer serve just for carrying current but can, if made from a material with a high thermal capacity, serve as an intermediate store, from which the heat is passed on to heat sinks connected to it and is dissipated.

It is particularly advantageous if the semiconductor elements are configured as semiconductor cells, for example as silicon cells.

If the two bars consist of a material with a thermal capacity greater than 1.8 Ws/K/cm$^3$, such as aluminum for example, correspondingly good heat dissipation can be achieved with them.

With regard to carrying current and heat, it is particularly advantageous however if the two bars include copper.

In an advantageous way, one of the two copper bars include hard copper. This copper bar can then be used as a component part of a pressing device for the pressure contacting mentioned above.

Furthermore, it proves to be particularly advantageous if a heat sink is connected to the hard copper bar, since in this way an interface with a low heat transfer resistance can be achieved.

The second of the two copper bars advantageously includes electrolytic copper, which is comparatively soft and deformable. If the second copper bar is made narrower in its central region, it is possible without any problem to compensate for small differences in thickness of the semiconductor elements.

If the electronic power module is assembled with two further electronic power modules of the same construction to form a three-phase unit, which is operated in conjunction with a contactor, this allows a motor to be operated in the starting phase and in continuous operation.

BRIEF DESCRIPTION OF THE DRAWINGS

An exemplary embodiment of the invention is explained in more detail below in an exemplary manner in conjunction with the drawings, in which.

DETAILED DESCRIPTION OF THE PREFERRED EMBODIMENTS

Figure 1:
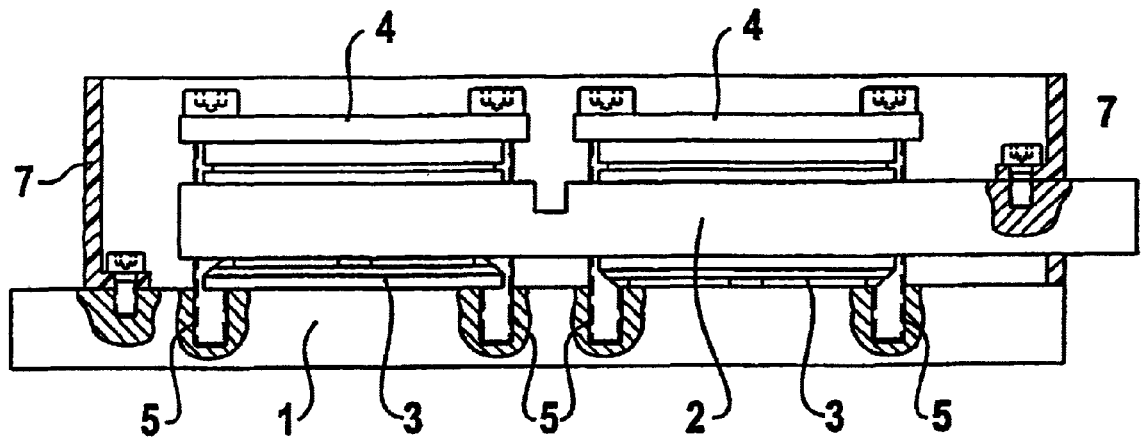
FIG. 1 shows a side view of an electronic power module according to an embodiment of the invention for short-term loading.

The electronic power module according to an embodiment of the invention as shown in FIG. 1 has two copper bars 1, 2 arranged in parallel, between which two silicon cells 3 have been introduced as semiconductor elements. The silicon cells 3 are configured as thyristors and arranged such that they are turned through 180°, producing an electrically anti-parallel circuit arrangement. Instead of thyristors, any other desired semiconductor components with a comparable function may be introduced.

The copper bars 1, 2 perform the task of carrying the heat losses occurring during the high short-term loading away from the silicon cells 3 as quickly as possible and storing them.

On account of the high volume-specific thermal capacity of approximately 3.4 Ws/K/cm³ and the high thermal conductivity, copper is particularly well suited as the material. The very good thermal conductivity of copper ensures very rapid removal of the lost heat from the silicon cell 3 and at the same time leads to uniform distribution and heating of the remaining copper that is not in the direct vicinity of the silicon cell 3. As compared with aluminum as a material for the bars, the dimensions can be reduced by ⅓ third when copper is used, because of its approximately 1.5 times higher volume-specific thermal capacity.

In principle, materials other than copper are also suitable, provided that they have a high thermal conductivity and a high volume-specific heat capacity. Alternatively, it would also be possible for example to use a combination of copper and a material which stores latent heat, for example a phase changing material (PCM).

Each silicon cell 3 is pressed over its surface area between the copper bars 1 and 2 by use of a special pressing device 4. The pressing of the silicon cells 3 leads to a pressure contact over the full surface area between the silicon cell 3 and the copper bars 1 and 2 and has the consequence of a low electrical and thermal transfer resistance at the bearing surfaces.

The pressure contacting ensures a high resistance to alternating thermal loading and consequently a long service life of the power module, which is necessary because of the exclusive operation with short-term loading.

The lower copper bar 1 in FIG. 1 includes harder copper, the upper copper bar 2 consists of soft electrolytic copper. Threads 5 for mounting the pressing devices 4 have been made in the lower copper bar 1. By choosing the harder copper, bending of the lower copper bar 1 as a consequence of the forces acting due to the pressing device is prevented to the greatest extent and the surface-area bearing of the silicon cells 3 is ensured. Furthermore, tearing out or running away of the threads 5 is prevented.

Fastened to the lower copper bar 1, for example by a screwed connection, is a heat sink 6 (see FIG. 2), in order to dissipate the heat losses occurring during the short-term loading. The use of harder copper provides a largely surface-area contact between the copper bar 1 and the heat sink 6, and consequently a low thermal transfer resistance.

The upper copper bar 2 is made narrower in the center, to make it possible to compensate for small differences in thickness of the silicon cells 3. This effect is also assisted by the use of soft electrolytic copper for the upper copper bar 2. This measure ensures pressure contact over the full surface area between the silicon cells 3 and the upper copper bar 2. It is possible here to dispense with a division of the upper copper bar 2 in the way provided by the prior art. By doing away with flexible, electrical connecting elements between the parts of the copper bars, which are present in the case of the prior art, the overall height of the electronic power module according to the invention can be reduced in comparison and the assembly effort can be reduced.

Figure 2:
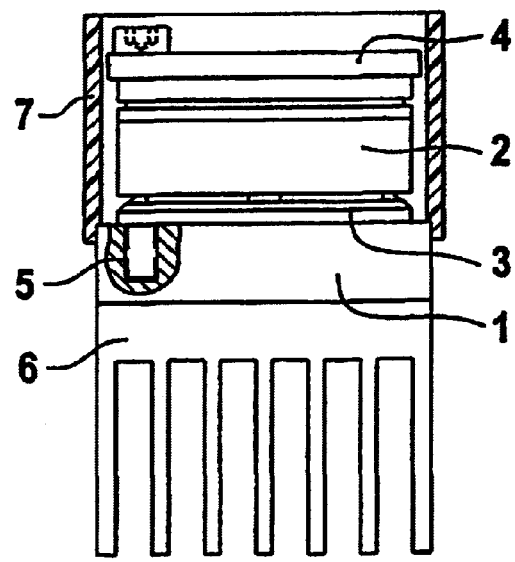
FIG. 2 shows a further side view of an electronic power module according to an embodiment of the invention with a connected heat sink and FIGS. 3, 4, 5 show side views of electronic power modules with different contacting.

According to FIG. 2, the heat sink 6 is advantageously connected in an electrically conducting manner to the lower copper bar 1. As a result, thermal transfer resistances are minimized and very good thermal coupling of the heat sink 6 to the power module is achieved. Consequently, the heat sink 6 likewise contributes with its thermal capacity to increasing the short-term loading capacity.

An electrically insulated attachment of the heat sink 6 with, for example, an electrically insulating film is likewise possible. On account of the approximately 3 to 5 times higher thermal transfer resistance of such films, compared with direct attachment, the contribution of the heat sink 6 to increasing the short-term loading capacity is reduced.

The upper copper bar 2 is made slightly narrower than the lower copper bar 1. This allows a plastic housing 7 to be attached around the upper copper bar 2 and the pressing device 4 without increasing the overall width of the power module. A polymer composition is subsequently introduced into the plastic housing 7 in order to ensure the dielectric strength between the two copper bars 1, 2. The copper bars 1, 3, the semiconductor cells 3 and the pressing device 4 are encapsulated together to form a module.

Figure 3:
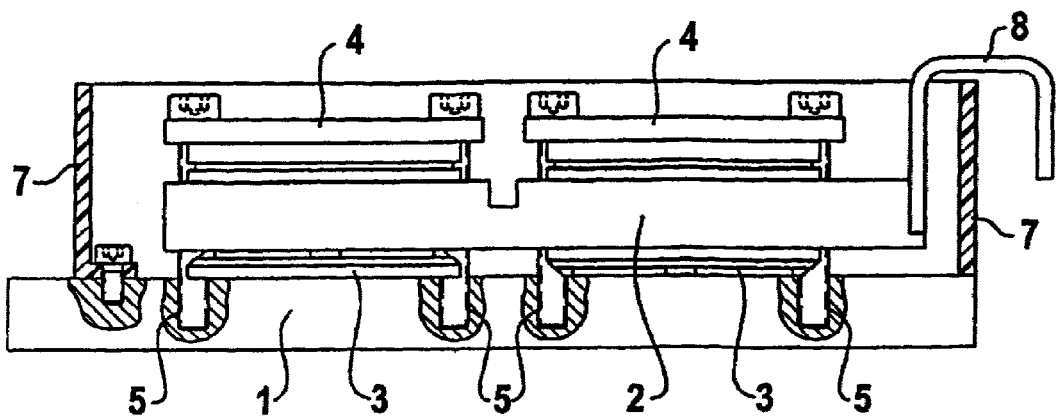
Figure 4:
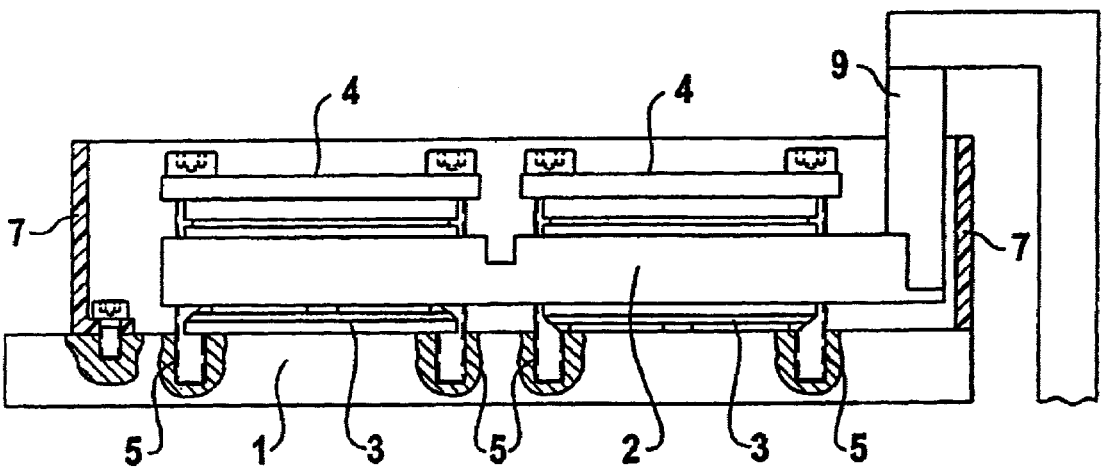
Figure 5:
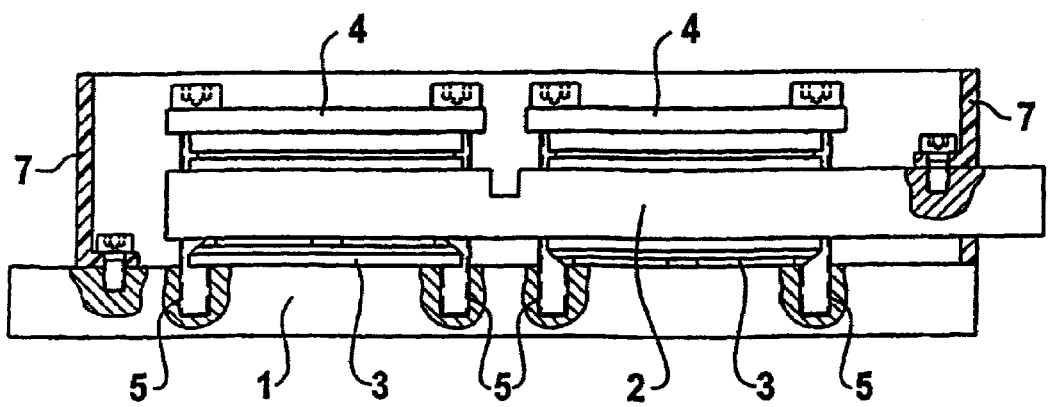

The electrical contacting may take place at the end face on the lower copper bar 1. The electrical connection to the upper copper bar may be configured differently, depending on the installation situation according to FIGS. 3, 4, 5. In FIG. 3, the contacting of the upper copper bar 2 is performed within the housing 7 by means of a flat copper material 8 bent in a U-shaped manner. In FIG. 4, a piece of copper bar 9 taken perpendicularly upward and formed in a stepped manner at the lower end is used for this purpose. FIG. 5 shows a connection of the two copper bars 1 and 2 at their end faces.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electronic power module for the smooth starting of motors, comprising:
   two semiconductor elements, connected in an electrically anti-parallel manner;
   at least one heat sink for dissipating heat loss of the semiconductor elements; and
   at least two conducting bars, between which the two semiconductor elements are clamped by pressure contacting;
   wherein one of the at least two bars includes hard copper;
   wherein another one of the at least two bars includes electrolytic copper.

2. The electronic power module as claimed in claim 1, wherein the semiconductor elements are configured as semiconductor cells.

3. The electronic power module as claimed in claim 2, wherein the at least two bars include a material with a thermal capacity greater than 1.8 Ws/K/cm³.

4. The electronic power module as claimed in claim 1, wherein the at least two bars include copper.

5. The electronic power module as claimed in claim 1, wherein a heat sink is connected to the hard copper bar.

6. The electronic power module as claimed in claim 5, wherein the hard copper bar is connected in an electrically conducting manner to the heat sink.

7. The electronic power module as claimed in claim 5, wherein an insulating film lies between the hard copper bar and the heat sink.

8. The electronic power module as claimed in claim 1, wherein the electrolytic copper bar is made relatively narrower in its central region.

9. The electronic power module as claimed in claim 1, further comprising a pressing device for applying a mechanical pressure, by which the semiconductor elements are clamped.

10. The electronic power module as claimed in claim 9, wherein the bars, semiconductor elements and the pressing device are encapsulated with one another to form a unit.

11. The electronic power module as claimed in claim 1, wherein the electronic power module is an electronic motor control device for the smooth starting of motors.

12. The electronic power module as claimed in claim 1, wherein the semiconductor cells are configured as thyristors.

13. A multi-phase unit, comprising at least two of the electronic power modules as claimed in claim 1.

14. An electronic power module, comprising:
a plurality of semiconductor elements, connected in an electrically anti-parallel manner;
at least one heat sink, adapted to dissipate heat loss of the semiconductor elements; and
at least two conducting bars, between which the plurality of semiconductor elements are clamped by pressure contacting;
wherein one of the at least two bars includes hard copper;
wherein another one of the at least two bars includes electrolytic copper.

15. The electronic power module as claimed in claim 14, wherein the semiconductor elements are semiconductor cells.

16. The electronic power module as claimed in claim 14, wherein a heat sink is connected to the hard copper bar.

17. The electronic power module as claimed in claim 16, wherein the hard copper bar is connected in an electrically conducting manner to the heat sink.

18. The electronic power module as claimed in claim 17, wherein an insulating film lies between the hard copper bar and the heat sink.

19. The electronic power module as claimed in claim 14, further comprising a pressing device for applying a mechanical pressure, by which the semiconductor elements are clamped.

20. The electronic power module as claimed in claim 19, wherein the bars, semiconductor elements and the pressing device are encapsulated with one another to form a unit.

21. The electronic power module as claimed in claim 14, wherein the electronic power module is an electronic motor control device for the smooth starting of motors.

22. The electronic power module as claimed in claim 14, wherein the semiconductor cells are configured as thyristors.

23. A multi-phase unit, comprising at least two of the electronic power modules as claimed in claim 14.

* * * * *